United States Patent
Sulfridge et al.

(10) Patent No.: US 11,626,440 B2
(45) Date of Patent: Apr. 11, 2023

(54) MICROLENS STRUCTURES FOR SEMICONDUCTOR DEVICE WITH SINGLE-PHOTON AVALANCHE DIODE PIXELS

(71) Applicant: SEMICONDUCTOR COMPONENTS INDUSTRIES, LLC, Phoenix, AZ (US)

(72) Inventors: Marc Allen Sulfridge, Boise, ID (US); Swarnal Borthakur, Boise, ID (US); Nathan Wayne Chapman, Middleton, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 68 days.

(21) Appl. No.: 16/684,033

(22) Filed: Nov. 14, 2019

(65) Prior Publication Data

US 2021/0151490 A1      May 20, 2021

(51) Int. Cl.
*H01L 27/14*  (2006.01)
*H01L 27/146* (2006.01)
*H01L 31/107* (2006.01)

(52) U.S. Cl.
CPC .. *H01L 27/14627* (2013.01); *H01L 27/14643* (2013.01); *H01L 27/14689* (2013.01); *H01L 31/107* (2013.01)

(58) Field of Classification Search
None
See application file for complete search history.

(56) References Cited

U.S. PATENT DOCUMENTS

| | | | | |
|---|---|---|---|---|
| 8,415,602 B2* | 4/2013 | Kikuchi | ............ | H01L 27/14645 250/239 |
| 9,209,320 B1* | 12/2015 | Webster | ............ | H01L 31/02027 |
| 2007/0117349 A1* | 5/2007 | Komatsu | ........... | H01L 27/14603 348/340 |
| 2008/0090323 A1* | 4/2008 | Wu | .................... | H01L 27/14621 438/70 |
| 2008/0272416 A1 | 11/2008 | Yun | | |
| 2009/0008729 A1* | 1/2009 | Yang | ................. | H01L 27/14618 257/E31.127 |
| 2009/0096050 A1 | 4/2009 | Park | | |
| 2010/0164034 A1 | 7/2010 | Park | | |
| 2015/0109501 A1* | 4/2015 | Sekine | ............. | H01L 27/14627 438/69 |
| 2021/0183930 A1* | 6/2021 | Takatsuka | ......... | H01L 27/14627 |

* cited by examiner

*Primary Examiner* — Bilkis Jahan
(74) *Attorney, Agent, or Firm* — Treyz Law Group, P.C.; David K. Cole

(57) ABSTRACT

An imaging device may include a plurality of single-photon avalanche diode (SPAD) pixels. The SPAD pixels may be overlapped by microlenses to direct light incident on the pixels onto photosensitive regions of the pixels and a containment grid with openings that surround each of the microlenses. During formation of the microlenses, the containment grid may prevent microlens material for adjacent SPAD pixels from merging. To ensure separation between the microlenses, the containment grid may be formed from material phobic to microlens material, or phobic material may be added over the containment grid material. Additionally, the containment grid may be formed from material that can absorb stray or off-angle light so that it does not reach the associated SPAD pixel, thereby reducing crosstalk during operation of the SPAD pixels.

10 Claims, 9 Drawing Sheets

MICROLENS STRUCTURES FOR SEMICONDUCTOR DEVICE WITH SINGLE-PHOTON AVALANCHE DIODE PIXELS

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals. Each pixel may also include a microlens that overlaps and focuses light onto the photosensitive element. Image sensors are sometimes designed to provide images to electronic devices using a Joint Photographic Experts Group (JPEG) format.

Conventional image sensors with backside-illuminated pixels may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. However, SPADs may require larger photosensitive regions than conventional image sensors and therefore may require thicker microlenses to focus light on the photosensitive elements within the SPADs. In order to apply microlenses thick enough to focus light in a desired manner, high viscosity material may be required. It may be difficult to control uniformity, patterning, and reflow characteristics when using high viscosity materials.

It would therefore be desirable to be able to provide improved microlens structures for single-photon avalanche diode pixels.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices (such as the ones described in connection with FIGS. 1-4), on the other hand, the photon detection principle is different. The light sensing diode is biased slightly above its breakdown point and when an incident photon generates an electron or hole, this carrier initiates an avalanche breakdown with additional carriers being generated. The avalanche multiplication may produce a current signal that can be easily detected by readout circuitry associated with the SPAD. The avalanche process needs to be stopped (quenched) by lowering the diode bias below its breakdown point. Each SPAD may therefore include a passive and/or active quenching circuit for quenching the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
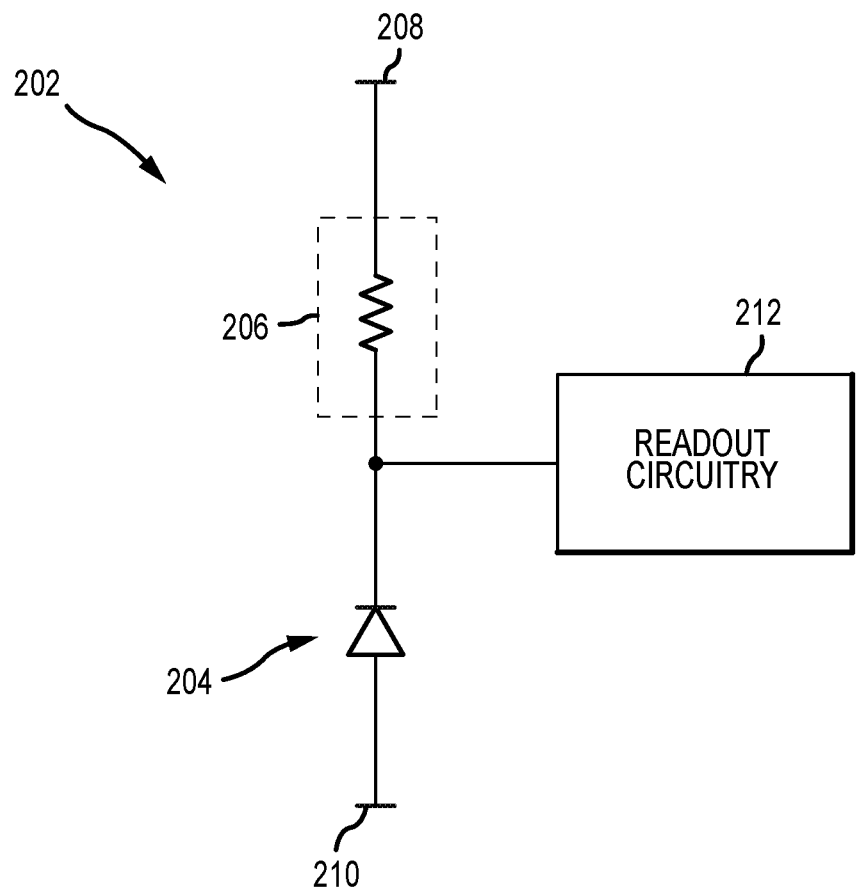
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 208 (e.g., a ground power supply voltage terminal) and a second supply voltage terminal 210 (e.g., a positive power supply voltage terminal). During operation of SPAD device 202, supply voltage terminals 208 and 210 may be used to bias SPAD 204 to a voltage that is higher than the breakdown voltage. Breakdown voltage is the largest reverse voltage that can be applied without causing an exponential increase in the leakage current in the diode. When SPAD 204 is biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor is used to form quenching circuitry 206. This is an example of passive quenching circuitry. After the avalanche is initiated, the resulting current rapidly discharges the capacity of the device, lowering the voltage at the SPAD to near to the breakdown voltage. The resistance associated with the resistor in quenching circuitry 206 may result in the final current being lower than required to sustain itself. The SPAD may then be reset to above the breakdown voltage to enable detection of another photon.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing.

In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect how many photons are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
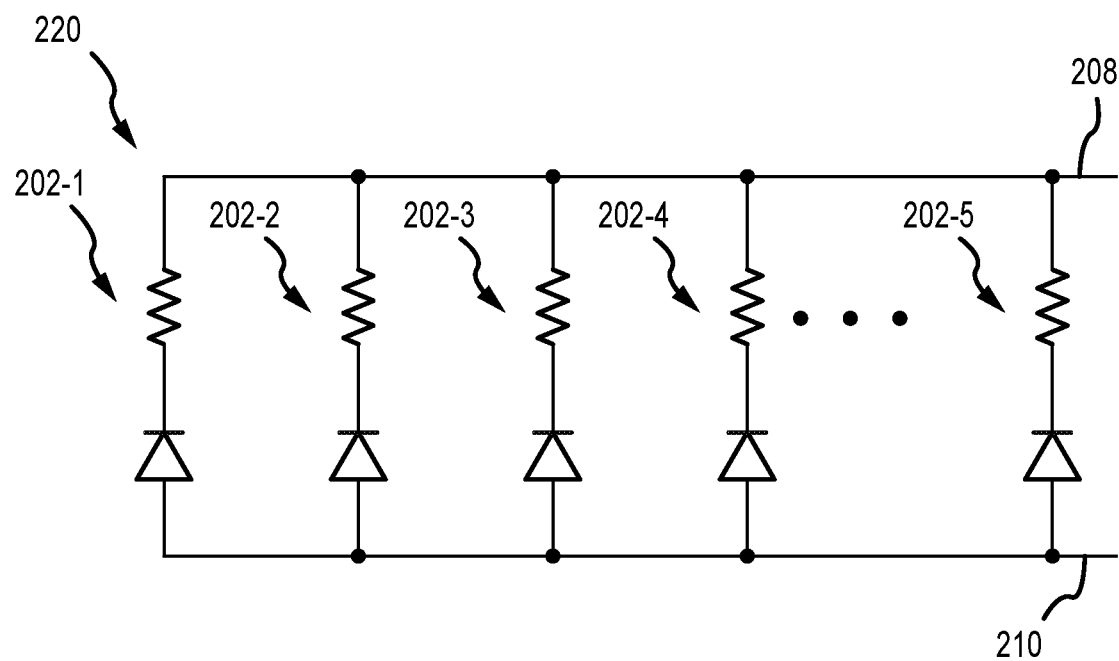
FIG. 2 is a diagram of an illustrative silicon photomultiplier in accordance with an embodiment.

Multiple SPAD devices may be grouped together to increase dynamic range. FIG. 2 is a circuit diagram of an illustrative group 220 of SPAD devices 202. The group of SPAD devices may be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier.

Herein, each SPAD device may be referred to as a SPAD pixel 202. Although not shown explicitly in FIG. 2, readout circuitry for the silicon photomultiplier may measure the combined output current from all of SPAD pixels in the silicon photomultiplier. In this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of a plurality of SPAD pixels having a common output in a silicon photomultiplier is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
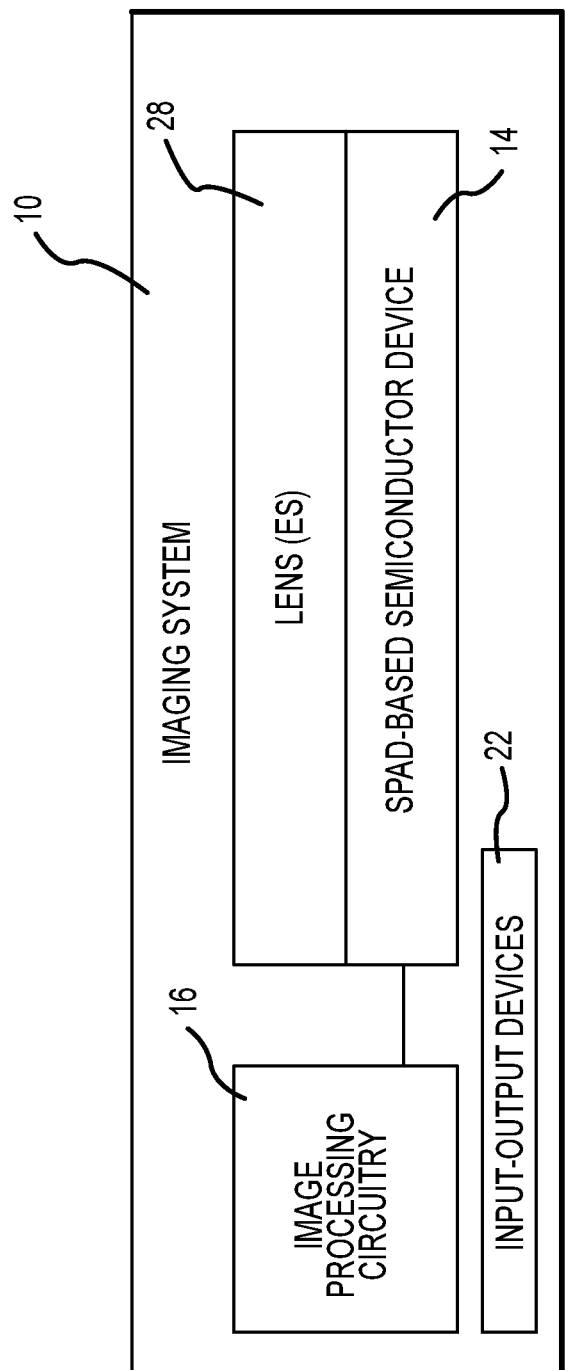
FIG. 3 is a schematic diagram of an illustrative imaging system with a SPAD-based semiconductor device in accordance with an embodiment.

An imaging system 10 with a SPAD-based semiconductor device is shown in FIG. 3. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system may be used for LIDAR applications.

Imaging system 14 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more).

The SPAD-based semiconductor device 14 may optionally include additional circuitry such as bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component may be included in the imaging system to emit light (e.g., infrared light or light of any other desired type). Semiconductor device 14 may measure the reflection of the light off of an object to measure distance to the object in a LIDAR (light detection and ranging) scheme.

Figure 4:
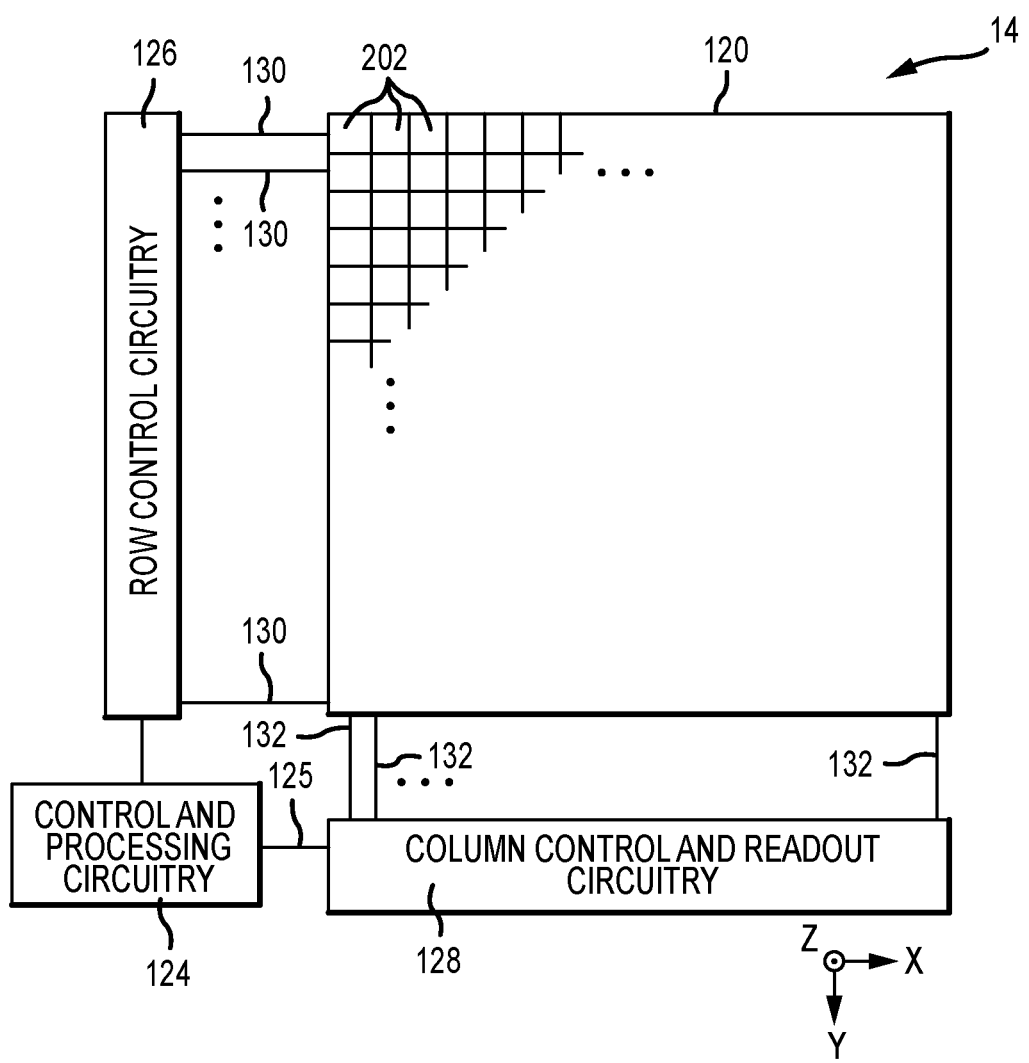
FIG. 4 is a diagram of an illustrative pixel array and associated readout circuitry for reading out image signals in a SPAD-based semiconductor device in accordance with an embodiment.

FIG. 4 shows one example for a semiconductor device 14 that includes an array 120 of SPAD pixels 202 (sometimes referred to herein as image pixels or pixels) arranged in rows and columns. Array 120 may contain, for example, hundreds or thousands of rows and columns of SPAD pixels 202. Each SPAD pixel may be coupled to an analog pulse counter that generates a corresponding pixel voltage based on received photons. Each SPAD pixel may be additionally or instead be coupled to a time-of-flight to voltage converter circuit. In both types of readout circuits, voltages may be stored on pixel capacitors and may later be scanned in a row-by-row fashion. Control circuitry 124 may be coupled to row control circuitry 126 and image readout circuitry 128 (sometimes referred to as column control circuitry, readout circuitry, processing circuitry, or column decoder circuitry). Row control circuitry 126 may receive row addresses from control circuitry 124 and supply corresponding row control signals to SPAD pixels 202 over row control paths 130. One or more conductive lines such as column lines 132 may be coupled to each column of pixels 202 in array 120. Column lines 132 may be used for reading out image signals from pixels 202 and for supplying bias signals (e.g., bias currents or bias voltages) to pixels 202. If desired, during pixel readout operations, a pixel row in array 120 may be selected using row control circuitry 126 and image signals generated by image pixels 202 in that pixel row can be read out along column lines 132.

Image readout circuitry 128 may receive image signals (e.g., analog or digital signals from the SPAD pixels) over column lines 132. Image readout circuitry 128 may include sample-and-hold circuitry for sampling and temporarily storing image signals read out from array 120, amplifier circuitry, analog-to-digital conversion (ADC) circuitry, bias circuitry, column memory, latch circuitry for selectively enabling or disabling the column circuitry, or other circuitry that is coupled to one or more columns of pixels in array 120 for operating pixels 202 and for reading out signals from pixels 122. ADC circuitry in readout circuitry 128 may convert analog pixel values received from array 120 into corresponding digital pixel values (sometimes referred to as digital image data or digital pixel data). Alternatively, ADC circuitry may be incorporated into each SPAD pixel 202. Image readout circuitry 128 may supply digital pixel data to control and processing circuitry 124 and/or image processing and data formatting circuitry 16 (FIG. 1) over path 125 for pixels in one or more pixel columns.

The example of image sensor 14 having readout circuitry to read out signals from the SPAD pixels in a row-by-row manner is merely illustrative. In other embodiments, the readout circuitry in the image sensor may simply include digital pulse counting circuits coupled to each SPAD pixel. Any other desired readout circuitry arrangement may be used.

If desired, array 120 may be part of a stacked-die arrangement in which pixels 202 of array 120 are split between two or more stacked substrates. Alternatively, pixels 202 may be formed in a first substrate and some or all of the corresponding control and readout circuitry may be formed in a second substrate. Each of the pixels 202 in the array 120 may be split between the two dies at any desired node within pixel.

It should be understood that instead of having an array of SPAD pixels as in FIG. 4, SPAD-based semiconductor device 14 may instead have an array of silicon photomultipliers (each of which includes multiple SPAD pixels with a common output).

Figure 5:
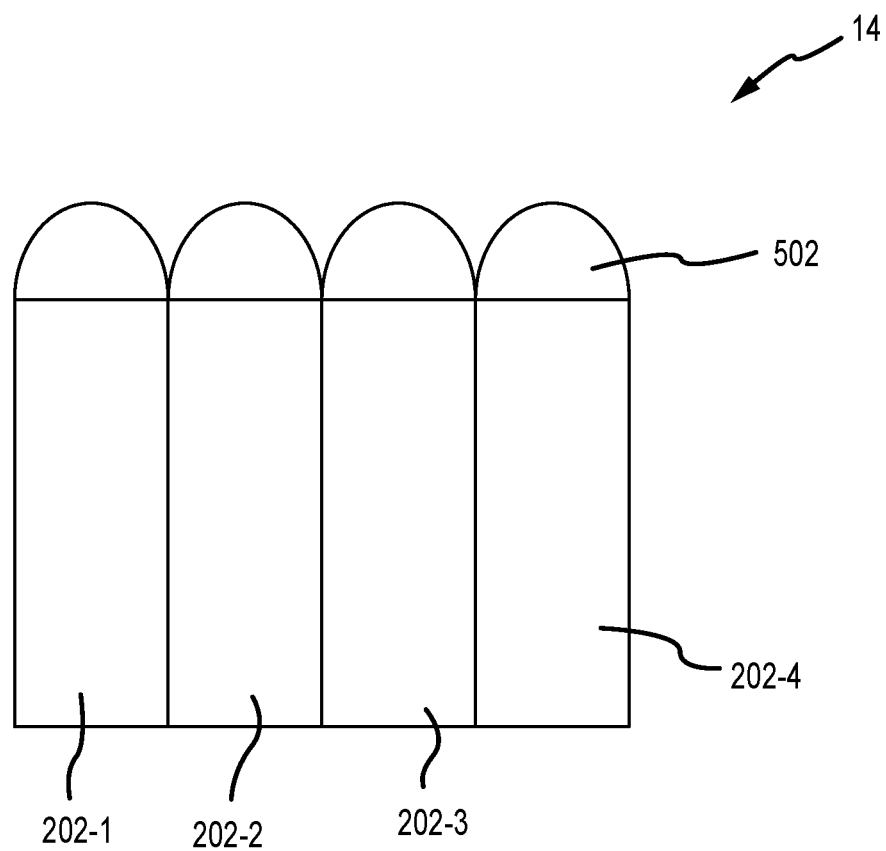
FIG. 5 is a cross-sectional diagram of illustrative SPAD pixels covered with microlenses in accordance with an embodiment.

As shown in FIG. 5, each SPAD pixel 202 in a group 220 of SPAD devices (see FIG. 2) may be covered by a microlens 502 (alternatively, each SPAD pixel 202 in the array of SPAD pixels shown in FIG. 4 may be covered by a microlens 502). In particular, each microlens 502 may focus incident light on an associated one of SPAD pixels 202. In general, microlenses 502 may be formed by any desired method. As an example, microlens material may be applied over SPAD pixels 202 and the reflowed to form microlenses 502. However, this merely illustrative. Any desired method may be used to form microlenses 502.

Regardless of the method used to form the microlenses, they may be too thin to focus light properly on the photosensitive regions when formed using conventional manufacturing methods and equipment. In particular, the SiPM devices may have SPAD pixels with pitches that are approximately between 20 microns and 35 microns wide. To focus light incident on image sensor onto the array of SPAD pixels, spherical microlenses with thicknesses of approximately 20 microns may be required. This is thicker than traditional microlenses, which may have thicknesses of approximately 5 microns, and standard equipment may therefore not be capable of forming microlenses for SiPM devices. To form microlenses with higher thicknesses, microlens material with a higher viscosity may be used. However, this poses additional issues, as uniformity, photo patterning, and reflow characteristics may be challenging when using high-viscosity material. For example, adjacent microlenses may merge together, as it may be difficult to maintain the shape and size of the microlenses, such as microlenses 502, during reflow operations. Therefore, it may be desired to use additional structures to control the formation of microlenses.

Figure 6:
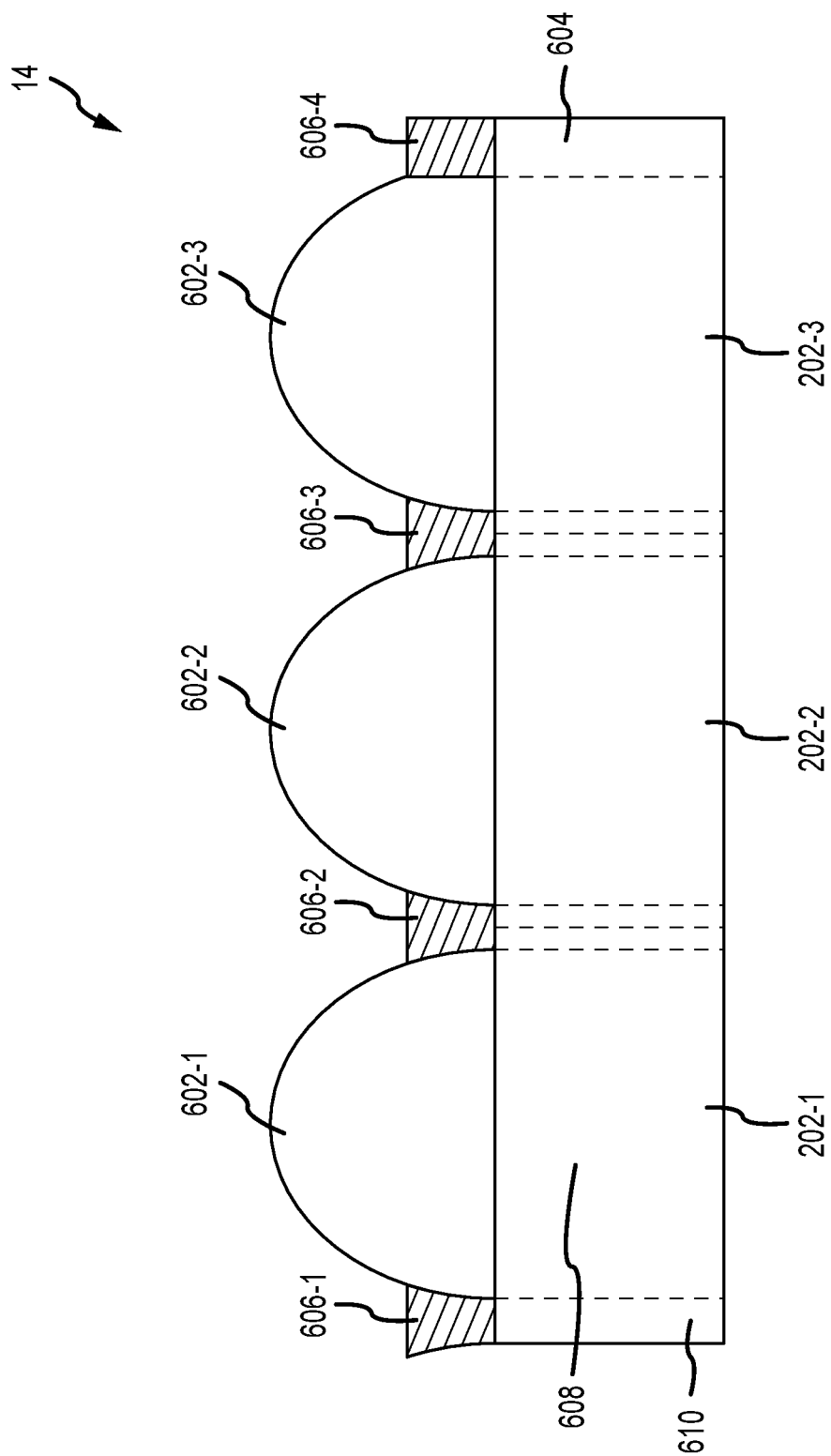
FIG. 6 is a cross-sectional diagram of illustrative SPAD pixels covered with microlenses that are separated by a containment grid in accordance with an embodiment.

As shown in FIG. 6, microlenses 602 may be formed on substrate 604. Substrate 604 may be a silicon substrate or may be formed from any desired material. SPAD pixels, such as SPAD pixels 202, may be formed in substrate 604, or substrate 604 may overlap SPAD pixels 202. In any case, microlenses 602 may overlap SPAD pixels (or other desired type of pixels) and direct light into the pixels.

As shown in FIG. 6, SPAD pixels 202 may optionally be formed in substrate 604. Each SPAD pixel 202 may have an active area 608 and an inactive area 610. Inactive area 610 may contain circuitry and space the SPAD pixels apart for more accurate photon detection (e.g., the space between pixels may reduce crosstalk between the pixels). Active area 608 may be sensitive to photons of incoming light. As a result, microlenses 602 may be formed over active areas 608, and containment grid 606 may be formed over inactive areas 610. If desired, however, portions of containment grid 606 may extend at least partially into active area 608. As an example, a tapered containment grid portion, such as grid portion 602-1 may overlap only inactive region 610 at substrate 604, but may flare up to additionally overlap a portion of active region 608. However, this is merely illustrative. Containment grid 606 may be confined to inactive region 610 or may extend partially into active region 608.

Microlenses 602 may be separated by containment grid 606. Containment grid 606 may help contain microlenses 602 within openings within the containment grid during reflow operations. In other words, the containment grid may prevent adjacent microlenses from merging. As shown in FIG. 6, containment grid portions 606-1 and 606-2 may help contain microlens 602-1, containment grid portions 606-2 and 606-3 may help contain microlens 602-2, and containment grid portions 606-3 and 606-4 may help contain microlens 602-3. The containment grid portions may have tapered shapes, as shown by containment grid portions 606-1, 606-2, and 606-3, may have flat walls, as shown by containment grid portion 606-4, or may have any other desired shape. In some embodiments, containment grid portions may have tapered shapes to help contain microlens material during the formation of microlenses 602. In general, containment grid portions 606 may all have substantially the same shape over the array of SPAD pixels 202, or may vary in shape across the array of pixels.

In some embodiments, the containment grid 606 may include material with a lower index of refraction than the microlens material (e.g., the material used to form microlenses 602). This may allow containment grid portions 606 to absorb high-angle light during operation of the SPAD pixels, thereby improving the accuracy of detection by the underlying SPAD pixels. Containment grid 606 may be formed from black material, metal, metal oxide, or dielectric materials, as examples. In general, any desired material may be used to form containment grid 606. In some cases, black or metal material may be used to absorb off-angle light. By blocking off-angle light, containment grid 606 may reduce crosstalk between adjacent SPAD pixels 202. In particular, crosstalk in SiPM/SPAD devices often occurs due to the emission of light of one pixel moving to an adjacent pixel and being absorbed. This is known as secondary photon generation crosstalk. By forming containment grid 606 from black material, metal material, or other absorptive material, the containment grid may absorb the generated photons and reduce crosstalk detected by neighboring pixels. In some embodiments, containment grid 606 may be extended at least partially into substrate 604 to provide absorption for light at higher angles.

Although containment grid portions 606 are shown as being much thinner than microlenses 602, this is merely illustrative. In general, containment grid portions 606 may extend to any desired height from substrate 604. For example, the containment grid may be made thicker to help converge normal incident light within silicon substrate 604. Alternatively, the containment grid may be made thinner to better focus off-angle light. In some embodiments, the microlenses may be at least two times thicker than the containment grid, at least three times thicker than the containment grid, at least ten times thicker than the containment grid, less than 15 times thicker than the containment grid, or at least five times thicker than the containment grid, as examples. Microlenses 602 may have thicknesses of less than 25 microns, less than 20 microns, less than 10 microns, less than 5 microns, greater than 3 microns, or less than 4 microns. However, the thickness of containment grid portions 606 and microlenses 602 may be adjusted as desired.

Moreover, although microlenses 602 are shown in FIG. 6 as being entirely between containment grid portions 606, this is merely illustrative. In some embodiments, microlenses 602 may at least partially overlap containment grid portions 606. For example, edge portions of microlenses 602 may overlap containment grid portions 606. This arrangement may allow microlenses 602 to have an increased standoff height relative to substrate 604, which in turn may improve the focusing ability of microlenses 602.

Although the example of FIG. 6 shows the microlenses applied directly over SPAD pixels 602 (e.g., a backside illuminated arrangement), a containment grid can also be used when forming microlenses over frontside illuminated image sensors, as well.

Microlenses 602 and containment grid 606 may be formed using any desired method. However, as previously discussed, it may be desirable to form microlenses 602 using a reflow process, so that microlens material may be applied across an array of SPAD pixels and then reflowed to shape the lenses. An illustrative process by which containment grid 606 and microlenses 602 may be formed is shown in FIG. 7.

Figure 7:
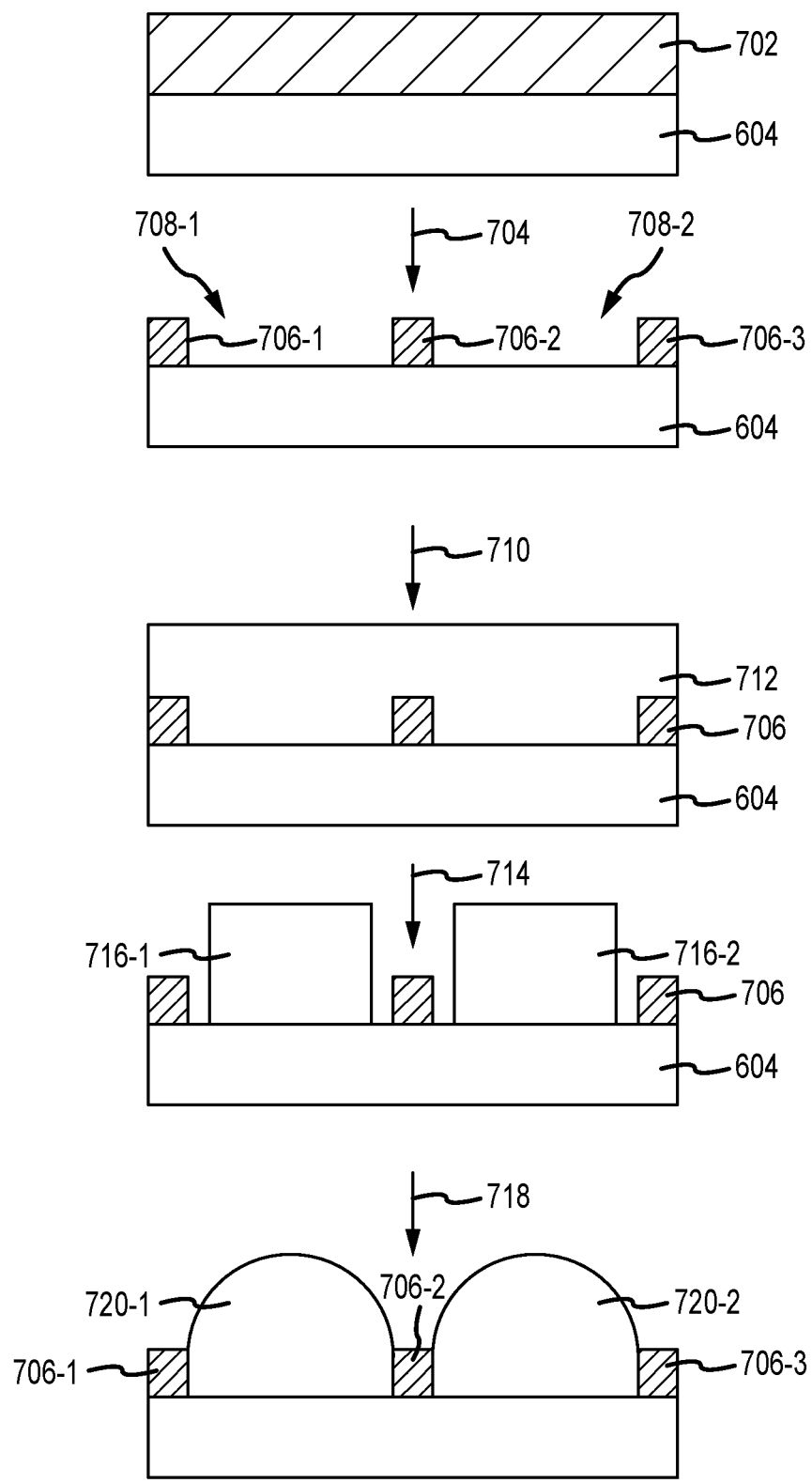
FIG. 7 is a process flow diagram of an illustrative method of forming a containment grid and interspersed microlenses in accordance with an embodiment.

As shown in FIG. 7, containment grid material 702 may be deposited on substrate 604. As discussed, substrate 604 may be any desired material, such as silicon. Containment grid material 702 may be metal, metal oxide, black material, or any other desired material. In some embodiments, containment grid material 702 may be configured to absorb light.

After containment grid material 702 has been deposited, the process flow may proceed along arrow 704, and the containment grid may be patterned to form openings in which microlenses will be formed. Any desired method may be used to pattern the containment grid, such as photolithography or etching. As shown in FIG. 7, containment grid portions 706-1 and 706-2 may at least partially surround opening 708-1, and containment grid portions 706-2 and 706-3 may at least partially surround opening 708-2. These openings may extend in two dimensions across the array of SPAD pixels 14.

Although containment grid portions 706 are shown as having flat walls, some or all of containment grid portions 706 may have tapered shapes, like containment grid portions 606-1, 606-2, and 606-3 of FIG. 6. This may help contain microlens material during formation of the microlenses. However, this shape is merely illustrative. In general, containment grid portions 706 may have any desired shapes.

The process may then proceed along arrow 710, and microlens material 712 may be deposited over containment grid 706 and substrate 604. Microlens material 712 may be formed from acrylic, silicon, any other desired material, or any desired combinations of materials. If desired, microlens material 712 may have a higher index of refraction than containment grid material 702. In this way, high-angle light may be redirected by microlens material 712 and be detected by the underlying SPAD pixels. However, this is merely illustrative. In general, any desired material may be used for microlens material 712.

After depositing microlens material 712, the process may proceed along arrow 714, and microlens material 712 may be patterned to form an array of patterned portions 716, which includes patterned portions 716-1 and 716-2. Microlens material 712 may be patterned using any desired technique, such as photolithography or etching. Although gaps are shown between patterned portions 716 and containment grid 706, this is merely illustrative. In some examples, it may be desirable to have less of a gap or no gap between patterned portions 716 and containment grid 706, as doing so may allow microlenses to overlap containment grid 706 and create additional standoff height from substrate 604.

The process may then proceed along arrow 718, and the patterned portions 716 may be reflowed to form an array of microlenses 720. All of the patterned portions 716 may be reflowed simultaneously, or some of the patterned portions 716 may be reflowed before other patterned portions 716. Patterned portions 716 may be reflowed in any desired manner to form microlenses 720. Microlenses 720 may have a spherical shape or any other desired shape. Moreover, microlens 720-1 may have the same shape as microlens 720-2 or the microlenses may have different shapes. In general, the reflow processes may be adjusted to create any desired shapes for microlenses 720 across the array of microlenses.

As shown, containment grid portions 706-1, 706-2, and 706-3 may help prevent microlenses 720-1 and 720-2 from merging during reflow operations. In particular, the containment grid portions may act as barriers to contain the microlens material as it is being reflowed. After formation of the microlenses, containment grid 706 may absorb off-axis secondary photons generated within the avalanche region of the SPAD, which could otherwise reflect back into adjacent SPADs, creating cross-talk. For example, containment grid 706 may be formed from black material, metal, or other light absorptive material to help prevent cross talk between SPAD pixels.

Although the method of FIG. 7 allows for the formation of microlenses within a containment grid, it may be desirable to use phobic material to prevent neighboring microlenses from merging above the containment grid. A process diagram illustrating the use of phobic material is shown in FIG. 8.

Figure 8:
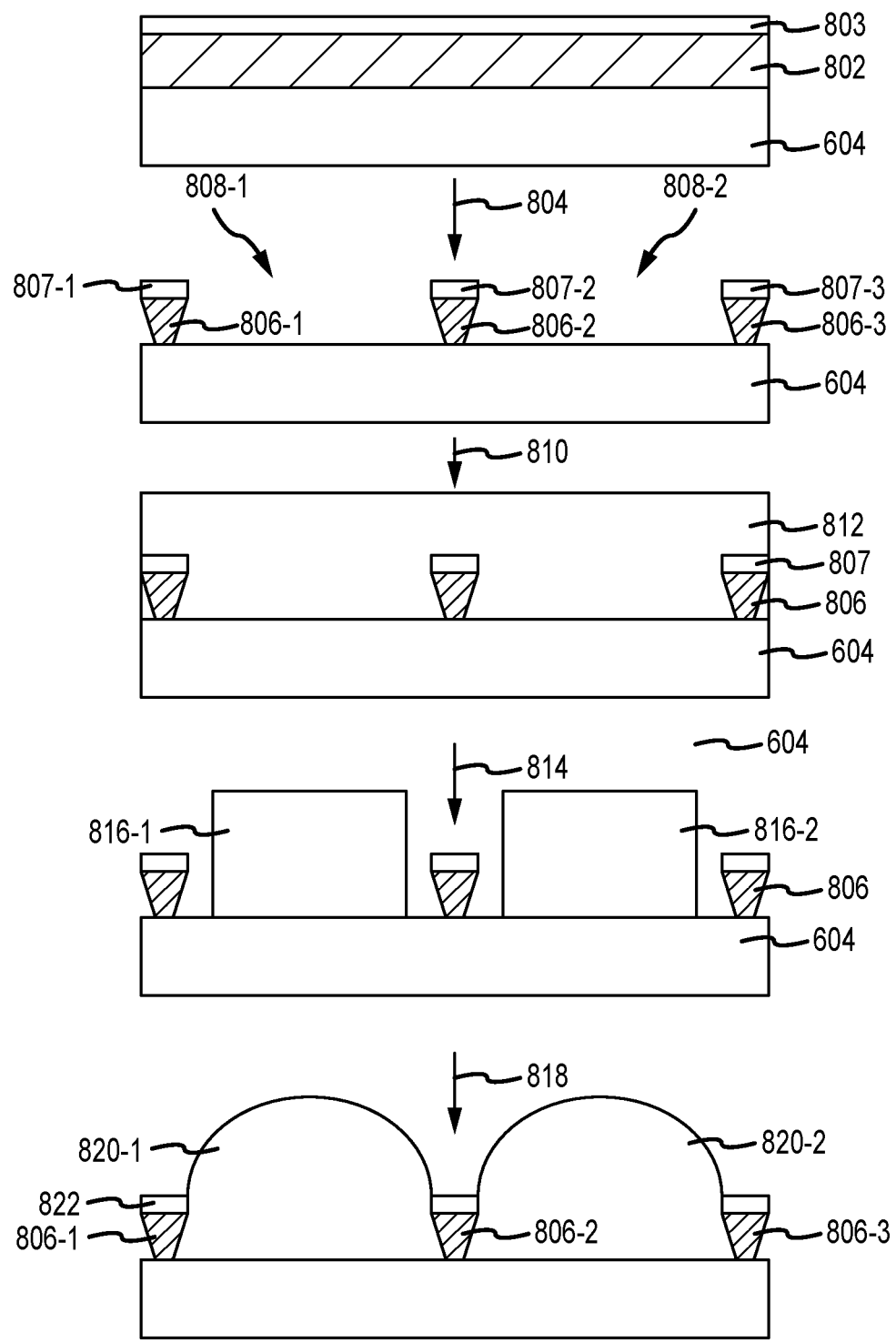
FIG. 8 is a process flow diagram of an illustrative method of forming a containment grid and interspersed microlenses using phobic material over the containment grid in accordance with an embodiment.

As shown in FIG. 8, containment grid material 802 may be deposited on substrate 604. As discussed, substrate 604 may be any desired material, such as silicon. Containment grid material 802 may be metal, metal oxide, black material, or any other desired material. In particular, containment grid material 802 may be phyllic with respect to microlens material. Therefore, the containment grid material may be silicon, oxides, or any other material that promotes the attachment of microlens material. In some embodiments, containment grid material 802 may also be configured to absorb light.

Phobic material 803 may be deposited on containment grid material 802. In particular, phobic material 803 may adhere poorly to microlens material. In general, phobic material 803 may be any desired material, such as a fluoropolymer.

After containment grid material 802 and phobic material 803 have been deposited, the process flow may proceed along arrow 804, and the containment grid and phobic material may be patterned to form openings in which microlenses will be formed. Any desired method may be used to pattern the containment grid and phobic material, such as photolithography or etching. As shown in FIG. 8, containment grid portions 806-1 and 806-2 and phobic portions 807-1 and 807-2 may at least partially surround opening 808-1, and containment grid portions 806-2 and 806-3 and phobic portions 807-2 and 807-3 may at least partially surround opening 808-2. These openings may extend in two dimensions across the array of SPAD pixels 14.

Although containment grid portions 806 are shown as having tapered shapes, some or all of containment grid portions 806 may have flat walls, like containment grid portion 606-4 of FIG. 6. However, this shape is merely illustrative. In general, containment grid portions 806 may have any desired shapes.

The process may then proceed along arrow 810, and microlens material 812 may be deposited over containment grid 806, phobic material 807, and substrate 604. Microlens material 812 may be formed from acrylic, silicon, any other desired material, or any desired combinations of materials. If desired, microlens material 812 may have a higher index of refraction than containment grid material 802. In this way, high-angle light may be redirected by microlens material 812 and be detected by the underlying SPAD pixels. However, this is merely illustrative. In general, any desired material may be used for microlens material 812.

After depositing microlens material 812, the process may proceed along arrow 814, and microlens material 812 may be patterned to form an array of patterned portions 816, which includes patterned portions 816-1 and 816-2. Microlens material 812 may be patterned using any desired technique, such as photolithography or etching. Although gaps are shown between patterned portions 816 and containment grid 806, this is merely illustrative. In some examples, it may be desirable to have less of a gap or no gap between patterned portions 816 and containment grid 806, as doing so may allow microlenses to overlap containment grid 806 and create additional standoff height from substrate 604.

The process may then proceed along arrow 818, and the patterned portions 816 may be reflowed to form an array of microlenses 820. All of the patterned portions 816 may be reflowed simultaneously, or some of the patterned portions 816 may be reflowed before other patterned portions 816. Patterned portions 816 may be reflowed in any desired manner to form microlenses 820. Microlenses 820 may have a spherical shape or any other desired shape. Moreover, microlens 820-1 may have the same shape as microlens 820-2 or they may have different shapes. In general, the reflow processes may be adjusted to create any desired shapes for microlenses 820 across the array of microlenses.

As shown, containment grid portions 806-1, 806-2, and 806-3 may help prevent microlenses 820-1 and 820-2 from merging during reflow operations. In particular, the containment grid portions may act as barriers to contain the microlens material as it is being reflowed. Additionally, phobic portions 822 may help prevent adjacent microlenses 820 from merging because the phobic material may be resistant to the microlens material. After formation of the microlenses, containment grid 806 may absorb off-axis light secondary photons generated within the avalanche region of the SPAD, which could otherwise reflect back into adjacent SPADs, creating cross-talk. For example, containment grid 806 may be formed from black material, metal, or other light absorptive material to help prevent cross talk between SPAD pixels.

In some cases, it may be desirable to use containment grid material that is phobic to microlens material. A process diagram illustrating the use of phobic containment grid material is shown in FIG. 9.

Figure 9:
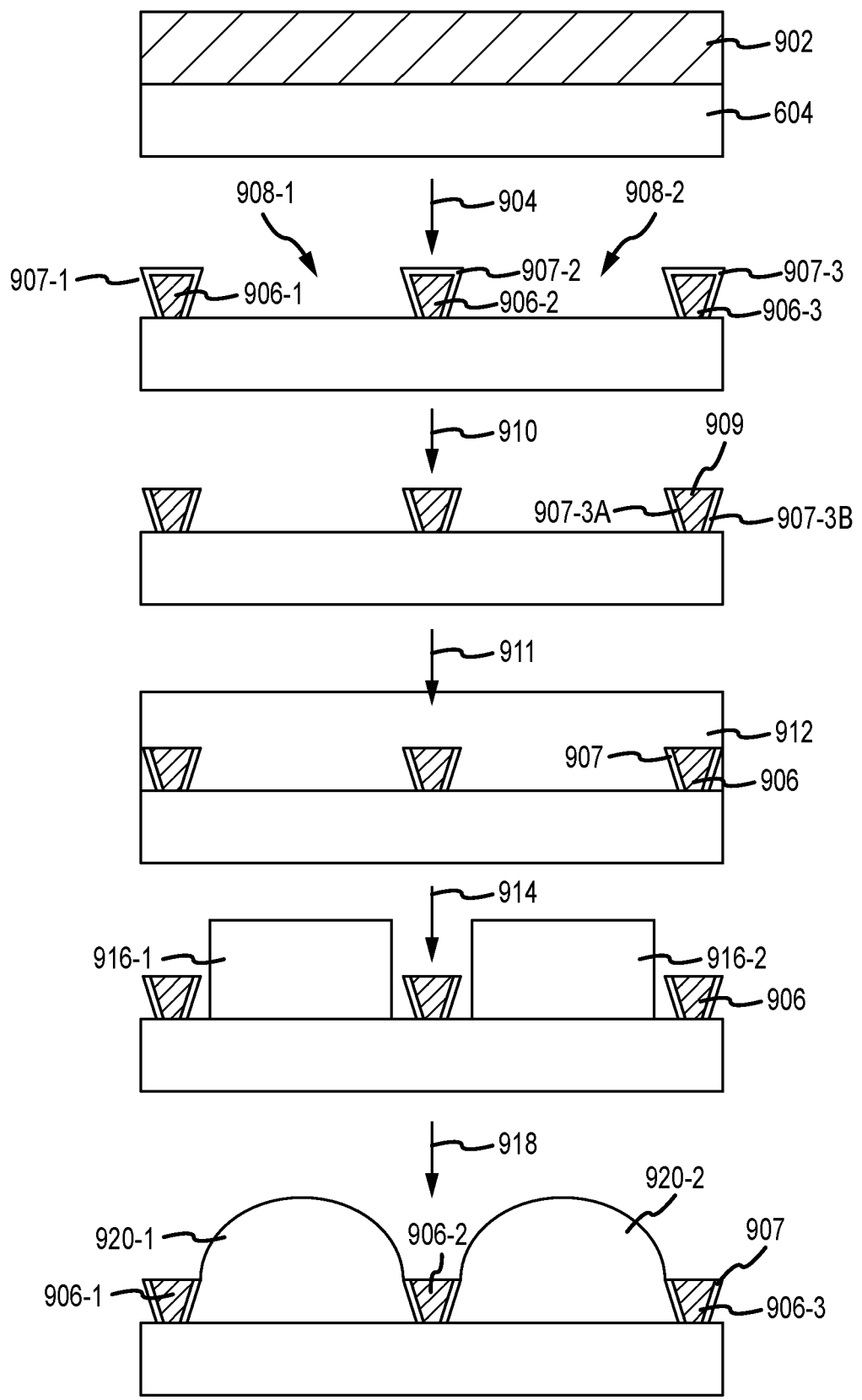
FIG. 9 is a process flow diagram of an illustrative method of forming a containment grid and interspersed microlenses using phobic material that surrounds portions of the containment grid in accordance with an embodiment.

As shown in FIG. 9, containment grid material 902 may be deposited on substrate 604. As discussed, substrate 604 may be any desired material, such as silicon. Containment grid material 902 may be metal, metal oxide, black material, or any other desired material. In particular, containment grid material 902 may be phobic with respect to microlens material. Therefore, the containment grid material may be metal, oxides, or any other material that resists the attachment of microlens material. In some embodiments, containment grid material 902 may also be configured to absorb light.

After containment grid material 902 has been deposited, the process flow may proceed along arrow 904, and the containment grid may be patterned to form openings in which microlenses will be formed. Any desired method may be used to pattern the containment grid and phobic material, such as photolithography or etching. Additionally, material that is phyllic to microlens material may be applied over containment grid portions 906. Phyllic material 907 may cover the top and sides of each of containment grid portions 906-1, 906-2, and 906-3. Alternatively, phyllic material 907 may cover only part of the containment grid portions. Phyllic material 907 may be acrylic, silicon, resin, oxides, or any other desired material that promotes adhesion to microlens material. In general, phyllic material 907 may cover any desired portion of the underlying containment portions and may be formed from any desired material.

As shown in FIG. 9, containment grid portions 906-1 and 906-2 and phyllic portions 907-1 and 907-2 may at least partially surround opening 908-1, and containment grid portions 906-2 and 906-3 and phobic portions 907-2 and 907-3 may at least partially surround opening 908-2. These openings may extend in two dimensions across the array of SPAD pixels 14.

Although containment grid portions 906 are shown as having tapered shapes, some or all of containment grid portions 906 may have flat walls, like containment grid portion 606-4 of FIG. 6. However, this shape is merely illustrative. In general, containment grid portions 906 may have any desired shapes.

The process may then proceed along arrow 910, and top portions of the phyllic material may be removed from each of the containment grid portions. As shown, this may expose upper surface 909 of each containment grid portion, and leave phyllic portions on the edge surfaces (as illustrated by phyllic portions 907-3A and 907-3B). The phyllic material may be removed using any desired process, such as etching.

Although FIG. 9 illustrates removing only a top portion of the phyllic material over each containment grid portion, this is merely illustrative. Any portion or portions of the phyllic material may be removed, as desired.

After removing the desired portions of the phyllic material, the process may proceed along arrow 911, and microlens material 912 may be deposited over containment grid 906, phyllic portions 907, and substrate 604. Microlens material 912 may be formed from acrylic, silicon, any other desired material, or any desired combinations of materials. If desired, microlens material 912 may have a higher index of refraction than containment grid material 902. In this way, high-angle light may be redirected by microlens material 812 and be detected by the underlying SPAD pixels. In some embodiments, microlens material 912 may be the same material as the material used to form phyllic portions 907, thereby promoting adhesion between the microlens material and the phyllic portions. However, this is merely illustrative. In general, any desired material may be used for microlens material 912.

After depositing microlens material 912, the process may proceed along arrow 914, and microlens material 912 may be patterned to form an array of patterned portions 916, which includes patterned portions 916-1 and 916-2. Microlens material 912 may be patterned using any desired technique, such as photolithography or etching. Although gaps are shown between patterned portions 916 and containment grid 906, this is merely illustrative. In some examples, it may be desirable to have less of a gap or no gap between patterned portions 916 and containment grid 906, as doing so may allow microlenses to overlap containment grid 906 and create additional standoff height from substrate 604.

The process may then proceed along arrow 918, and the patterned portions 916 may be reflowed to form an array of microlenses 920. All of the patterned portions 916 may be reflowed simultaneously, or some of the patterned portions 916 may be reflowed before other patterned portions 916. Patterned portions 916 may be reflowed in any desired manner to form microlenses 920. Microlenses 920 may have a spherical shape or any other desired shape. Moreover, microlens 920-1 may have the same shape as microlens 920-2 or they may have different shapes. In general, the reflow processes may be adjusted to create any desired shapes for microlenses 920 across the array of microlenses.

As shown, containment grid portions 906-1, 906-2, and 906-3 may help prevent microlenses 920-1 and 920-2 from merging during reflow operations. In particular, the containment grid portions may act as barriers to contain the microlens material as it is being reflowed. Due to the presence of phyllic portions 907 along the sides of the containment grid portions, the microlens material may be attracted to the phyllic portions during reflow operations. Additionally, since the phyllic material was removed from the top surfaces of the containment grid portions and the containment grid portions are formed from phobic material, the microlens material may not adhere well to these surfaces. This may help prevent merging between adjacent microlenses. After formation of the microlenses, containment grid 906 may absorb off-axis secondary photons generated within the avalanche region of the SPAD, which could otherwise reflect back into adjacent SPADs, creating cross-talk. For example, containment grid 906 may be formed from black material, metal, or other light absorptive material to help prevent cross talk between SPAD pixels.

In any of the aforementioned embodiments, it should be understood that a silicon photomultiplier (with multiple SPAD pixels having a common output) may be used in place of a single SPAD pixel. Each SPAD pixel in the silicon multiplier may be covered by a microlens, or multiple SPAD pixels within the silicon multiplier may be covered by a single microlens, if desired.

Although each of the aforementioned embodiments have been described as applying a microlens over SPAD pixels, the microlenses may be formed over any desired pixel type. For example, the foregoing microlenses may be applied over pixels in conventional CMOS imagers.

In accordance with an embodiment, a semiconductor device may include a plurality of single-photon avalanche diode pixels. Each of the single-photon avalanche diode pixels may have an active region and an inactive region. The semiconductor device may also include a plurality of microlenses, each of which covers the active region of a respective one of the single-photon avalanche diode pixels, and a containment grid that covers the inactive regions of the single-photon avalanche diode pixels. Portions of the containment grid may be interposed between adjacent microlenses of the plurality of microlenses.

In accordance with various embodiments, the portions of the containment grid may each have a tapered shape between the microlenses.

In accordance with various embodiments, the portions of the containment grid may each have flat sidewalls between the microlenses.

In accordance with various embodiments, the containment grid may include containment grid material with a first index of refraction, the microlenses may include microlens material with a second index of refraction, and the second index of refraction may be higher than the first index of refraction.

In accordance with various embodiments, the containment grid may include a material selected from the group consisting of: metal material, metal oxide material, silicon material and black material.

In accordance with various embodiments, each of the containment grid portions may have a top surface, and the semiconductor device may further include material that is phobic to the microlens material on at least some of the top surfaces.

In accordance with various embodiments, the containment grid may include material that is phobic to the microlens material.

In accordance with various embodiments, the semiconductor device may further include material that is phyllic to the microlens material interposed between at least some of the containment grid portions and the microlenses.

In accordance with various embodiments, each of the microlenses may have a first height, the containment grid may have a second height, and the first height may be greater than the second height.

In accordance with various embodiments, the first height may be at least ten times greater than the second height.

In accordance with an embodiment, a method of forming microlenses over a plurality of single-photon avalanche diodes may include depositing containment grid material on a semiconductor substrate, patterning the containment grid material to form an array of openings, depositing microlens material over the containment grid material and the semiconductor substrate, and patterning and reflowing the microlens material to form microlenses in the openings of the containment grid material.

In accordance with various embodiments, the method may further include depositing phobic material over the containment grid material, and patterning the containment grid material to form an array of openings may include patterning the containment grid material and the phobic material.

In accordance with various embodiments, the containment grid may be phobic to the microlens material, and the method may further include before depositing the microlens material, depositing phyllic material on the patterned containment grid material, and etching a surface of the phyllic material to expose a portion of the containment grid material.

In accordance with various embodiments, depositing the containment grid material may include depositing the containment grid material to a first height from semiconductor substrate, and depositing the microlens material may include depositing the microlens material to a second height from the substrate that is at least ten times greater than the first height.

In accordance with various embodiments, patterning the containment grid material may include forming containment grid portions having a shape selected from the group consisting of: a tapered shape and a flat-walled shape.

In accordance with an embodiment, a semiconductor device may include a single-photon avalanche diode pixel having an active region and an inactive region, a containment grid having portions that cover the inactive region and having an opening that overlap the active region, and a microlens in the opening of the containment grid that overlaps the active region.

In accordance with various embodiments, the single-photon avalanche diode pixel may be a pixel in an array of single-photon avalanche diode pixels, and the containment grid may include containment grid material that absorbs stray light and prevents cross talk between adjacent pixels in the array of pixels.

In accordance with various embodiments, the containment grid material may be selected from the group of material consisting of: black material and metal oxide material.

In accordance with various embodiments, the microlens may include microlens material, and the containment grid material may be phobic to the microlens. The semiconductor device may further include additional material that is phyllic to the microlens material interposed between the containment grid material and the microlens material.

In accordance with various embodiments, the containment grid material may have a first index of refraction and the microlens may be formed from microlens material that has a second index of refraction that is greater than the first index of refraction.

The foregoing is merely illustrative of the principles of this invention and various modifications can be made by those skilled in the art. The foregoing embodiments may be implemented individually or in any combination.

What is claimed is:

1. A semiconductor device comprising:
   a plurality of single-photon avalanche diode pixels, wherein each of the single-photon avalanche diode pixels has an active region and an inactive region;
   a plurality of microlenses comprising microlens material, wherein each of the microlenses covers the active region of a respective one of the single-photon avalanche diode pixels;
   a containment grid that covers the inactive regions of the single-photon avalanche diode pixels, wherein portions of the containment grid are interposed between adjacent microlenses of the plurality of microlenses and wherein each of the portions of the containment grid has a top surface; and
   material that is phobic to the microlens material on at least some of the top surfaces.

2. The semiconductor device defined in claim 1 wherein the portions of the containment grid each have a tapered shape between the microlenses.

3. The semiconductor device defined in claim 1 wherein the containment grid comprises containment grid material with a first index of refraction, the microlens material has a second index of refraction, and the second index of refraction is higher than the first index of refraction.

4. The semiconductor device defined in claim 1 wherein the containment grid comprises a material selected from the group consisting of: metal material, metal oxide material, silicon material, and black material.

5. The semiconductor device defined in claim 1 wherein the each of the microlenses has a first height, the containment grid has a second height, and the first height is greater than the second height.

6. The semiconductor device defined in claim 5 wherein the first height is at least ten times greater than the second height.

7. A semiconductor device comprising:
   a semiconductor substrate, wherein the semiconductor substrate has opposing first and second surfaces;
   a single-photon avalanche diode pixel formed in the semiconductor substrate and having an active region and an inactive region, wherein the inactive region comprises semiconductor material and extends from the first surface to the second surface;
   a containment grid on the first surface and having portions that overlap the inactive region in a given direction, wherein the containment grid has an opening that overlaps the active region;
   a microlens in the opening of the containment grid on the first surface of the semiconductor substrate that overlaps the active region in the given direction, wherein the microlens comprises a microlens material; and
   material that is phobic to the microlens material on the containment grid.

8. The semiconductor device defined in claim 7 wherein the single-photon avalanche diode pixel is a pixel in an array of single-photon avalanche diode pixels, and wherein the containment grid comprises containment grid material that is configured to absorb stray light and prevent cross talk between adjacent pixels in the array of pixels.

9. The semiconductor device defined in claim 8 wherein the containment grid material is selected from the group of material consisting of: black material and metal oxide material.

10. The semiconductor device defined in claim 8 wherein the containment grid material has a first index of refraction and wherein the microlens is formed from microlens material that has a second index of refraction that is greater than the first index of refraction.

* * * * *